(12) United States Patent
Koganezawa et al.

(10) Patent No.: US 6,724,560 B2
(45) Date of Patent: Apr. 20, 2004

(54) HEAD ASSEMBLY EMPLOYING MICROACTUATOR IN RECORDING MEDIUM DRIVE

(75) Inventors: Shinji Koganezawa, Kawasaki (JP); Takahiro Imamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 531 days.

(21) Appl. No.: 09/738,163

(22) Filed: Dec. 15, 2000

(65) Prior Publication Data

US 2001/0033452 A1 Oct. 25, 2001

(30) Foreign Application Priority Data

Apr. 20, 2000 (JP) ........................ 2000-119284

(51) Int. Cl.[7] .................... G11B 5/596; G11B 17/00
(52) U.S. Cl. ................ 360/77.02; 360/78.05; 360/97.01; 360/294.4
(58) Field of Search ............... 360/77.02, 78.05, 360/97.01, 794.4, 794.6

(56) References Cited

U.S. PATENT DOCUMENTS

| | | | | |
|---|---|---|---|---|
| 5,719,720 A | * | 2/1998 | Lee | 360/71 |
| 6,310,746 B1 | * | 10/2001 | Hawwa et al. | 360/97.01 |
| 6,310,750 B1 | * | 10/2001 | Hawwa et al. | 360/294.6 |
| 6,351,341 B1 | * | 2/2002 | Lee et al. | 360/75 |
| 6,504,669 B1 | * | 1/2003 | Janz et al. | 360/78.05 |

FOREIGN PATENT DOCUMENTS

| | | |
|---|---|---|
| JP | 54100687 A | 8/1979 |
| JP | 05225734 | 9/1993 |
| JP | 05243633 | 9/1993 |
| JP | 2528261 | 6/1996 |
| JP | 09074234 | 3/1997 |
| JP | 11031368 | 2/1999 |

* cited by examiner

*Primary Examiner*—David Hudspeth
*Assistant Examiner*—Jason Olson
(74) *Attorney, Agent, or Firm*—Greer, Burns & Crain, Ltd.

(57) ABSTRACT

A head suspension supporting a head at the tip end is allowed to swing at the tip end of a carriage in a recording disk drive. A microactuator is interposed between the head suspension and the carriage. A resistor is connected to the microactuator in serial. The microactuator is allowed to function as a capacitance. A combination of the microactuator and the resistor enables establishment of a so-called low pass filter. A high frequency noise involuntarily introduced in the driving voltage for the microactuator can be eliminated or removed from the driving voltage. Elimination of the high frequency noise enables a reliable prevention of the mechanical or physical resonance or vibration in the head suspension. A tracking action of the head related to a target recording track can reliably be stabilized.

10 Claims, 9 Drawing Sheets

HEAD ASSEMBLY EMPLOYING MICROACTUATOR IN RECORDING MEDIUM DRIVE

BACKGROUND OF THE INVENTION

1. Field of the Invention

The present invention relates to a head assembly employed in a recording medium drive such as a hard disk drive (HDD), and in particular, to a head assembly utilizing a so-called microactuator capable of moving or shifting a head in a recording medium drive.

2. Description of the Prior Art

Japanese Patent No. 2528261 and Japanese Patent Application Laid-open No. 11-31368 disclose a well-known type of hard disk drives (HDDs), representing a magnetic recording disk drive, including a head suspension supported at the tip end of a carriage horizontally extending. The head suspension is movable relative to the carriage which is allowed for swinging movement around the vertical axis. The mentioned HDD allows the carriage to swing so as to achieve a seeking action of a read/write head related to a target recording track. The carriage is also supposed to cooperate with the head suspension for forcing a read/write head to follow the target recording track in a tracking operation. A microactuator, such as a piezoelectric element, is interposed between the carriage and the head suspension so as to cause a relative swinging movement between the carriage and the head suspension.

In general, a so-called servo control is utilized to achieve a tracking operation. The servo control usually achieves a feedback control of the microactuator based on a signal supplied from a read/write head. The signal serves to represent a deviation amount of the read/write head from a target recording track. If a high frequency component is introduced in the driving voltage supplied to the microactuator in the feedback control, the head suspension suffers from a mechanical or physical resonance or vibration, so that the tracking action of the read/write head may be hindered. A reliable or stable tracking operation cannot be achieved. The high frequency component may inevitably be generated based on the feedback signal following a frequent variation in the deviation amount of the read/write head, for example. Otherwise, the high frequency component may be found as a noise in the output of an amplifier designed to amplify the driving voltage.

SUMMARY OF THE INVENTION

It is accordingly an object of the present invention to provide a head assembly and/or a recording medium drive capable of stabilizing, with a simple structure, the tracking action of a head during a servo control of an microactuator.

According to a first aspect of the present invention, there is provided a recording medium drive comprising: a recording medium; a head related to the recording medium; a driven member supporting the head; a support member designed to support the driven member for a relative movement; a microactuator interposed between the driven member and the support member so as to cause the relative movement between the driven member and the support member based on a driving voltage; a voltage source generating the driving voltage following variation in a feedback signal generated based on a position of the head relative to the recording medium; and a resistor interposed in serial between the voltage source and the microactuator.

The microactuator is allowed to operate in response to supply of the driving voltage so as to position the head with respect to a target recording track on the recording medium in the recording medium drive. The driving voltage is designed to follow variation in the feedback signal, so that a tracking action of the head related to the target recording track, namely, a servo control of the driven member can be achieved. When a piezoelectric element or a so-called capacitance actuator is utilized in the microactuator, for example, the microactuator is inevitably forced to function as a capacitance. A combination of the microactuator and the resistor enables establishment of a so-called low pass filter. As a result, a high frequency noise involuntarily introduced in the driving voltage can be eliminated or removed from the driving voltage. In general, the driven member has a natural frequency of a relatively higher frequency in the recording medium drive because of its weight or mass. Elimination of the high frequency noise enables a reliable prevention of the mechanical or physical resonance or vibration resulting from the weight or mass of the driven member and the like. It should be noted that the microactuator may comprise any structure equivalent to a capacitance in addition to the aforementioned piezoelectric element and capacitance actuator.

It is preferable that the resistor is inserted in a driving signal line attached to the support member for carrying the driving voltage to the microactuator. In general, the driving signal line is often disposed adjacent a data signal line for carrying data signals of the head. If the resistor can be located closer to the microactuator in the driving signal line, the resistor is allowed to eliminate an electromagnetic noise leaking out of the data signal line and/or a motor for driving the recording medium. As a result, the servo control can further be stabilized.

In addition, according to a second aspect of the present invention, there is provided a head assembly comprising: a plurality of heads; a plurality of driven members respectively supporting the head; a common support member designed to support the driven members for a relative movement; data signal lines attached to the support member for carrying a data signal of the head; a microactuator interposed between the individual driven member and the support member so as to cause the relative movement between the individual driven member and the support member based on a driving voltage; a driving signal line attached to the support member for carrying the driving voltage to the microactuator; and a resistor inserted in the driving signal line between the microactuator and a voltage source of the driving voltage.

In the same manner as the first aspect, the microactuator is allowed to operate in response to supply of the driving voltage so as to achieve a tracking action of the individual head related to the target recording track, namely, a servo control of the driven member. When a piezoelectric element or a so-called capacitance actuator is utilized in the microactuator, for example, the microactuator is inevitably forced to function as a capacitance. A combination of the microactuator and the resistor enables establishment of a so-called low pass filter. As a result, a high frequency noise involuntarily introduced in the driving voltage can be eliminated or removed from the driving voltage in the aforementioned manner.

In particular, the driving signal line may comprise: a common driving signal line extending from the voltage source to a branch point so as to accept interposition of the resistor; and a plurality of branch driving signal lines respectively extending from the branch point to the individual microactuator. If the single resistor is assigned to a group of the branch driving signal lines, less resistors are required, as compared with the case where the resistors are inserted in every driving signal line. Cost reduction can be achieved.

Further, according to a third aspect of the present invention, there is provided a head assembly comprising: a piezoelectric element deforming in response to supply of a driving voltage; first and second electrodes holding the piezoelectric element therebetween and leading the driving voltage to the piezoelectric element; a conductive adhesive layer interposed between the piezoelectric element and at least one of the first and second electrodes; a driven member fixed to the first electrode so as to support a head; a support member fixed to the second electrode; and a driving signal line connected to the first and second electrodes so as to lead the driving voltage to the first and second electrodes.

In the head assembly, the resistor of a predetermined resistive value can easily be obtained by properly selecting the material of conductive powders contained in the conductive adhesive layer and/or adjusting the amount of the conductive powder. Employment of such a resistor comprising the conductive adhesive layer serves to locate the resistor closest to the piezoelectric element, so that the resistor made of the conductive adhesive is allowed to reliably eliminate or remove a high frequency noise involuntarily introduced in the driving signal line. A conductive adhesive containing a predetermined amount of conductive powder may be injected between the first electrode and the piezoelectric element as well as between the second electrode and the piezoelectric element so as to form the conductive adhesive layer interposed between the piezoelectric element and at least one of the first and second electrodes. When the injected conductive adhesive is cured or hardened, the conductive adhesive layer can be obtained.

Furthermore, according to a fourth aspect of the present invention, there is provided a recording medium drive comprising: an enclosure defining an inner space; a recording medium disposed within the inner space; a head disposed within the inner space with respect to the recording medium, a driven member supporting the head; a support member designed to support the driven member for a relative movement; a microactuator interposed between the driven member and the support member so as to cause the relative movement between the driven member and the support member based on a driving voltage; an amplifier amplifying a voltage from a voltage source so as to generate the driving voltage; and a DC/DC converter disposed outside the inner space and designed to supply a source voltage to the amplifier.

In general, the DC/DC converter is well known to generate or radiate a high frequency noise. The high frequency noise tends to be introduced in the driving voltage carried along the driving signal line. Also, the high frequency noise may directly act on the driven member so as to induce a mechanical resonance of the driven member. When the DC/DC converter isolated by the enclosure from the inner space in this manner, a high frequency noise leaking out of the DC/DC converter cannot reach the driven member and the driving signal line within the inner space. As a result, a stable servo control for the driven member can further be improved.

The recording medium drive of the invention may include a magnetic disk drive such as a hard disk drive (HDD), a diskette drive (FDD), and the like, an optical disk drive employing an optical medium such as a compact disk (CD), a digital video disk (DVD), and the like, a magneto-optical disk (MO) drive, and any other types. In particular, the head assembly of the invention can be applied to any of the aforementioned recording medium drives. Moreover, the microactuator of the invention may be interposed not only between a carriage and a head suspension, but also between a head suspension and a head slider as well as between a head slider and a head element, in any of the aforementioned recording medium drives.

BRIEF DESCRIPTION OF THE DRAWINGS

The above and other objects, features and advantages of the present invention will become apparent from the following description of the preferred embodiments in conjunction with the accompanying drawings, wherein.

DESCRIPTION OF THE PREFERRED EMBODIMENTS

Figure 1:
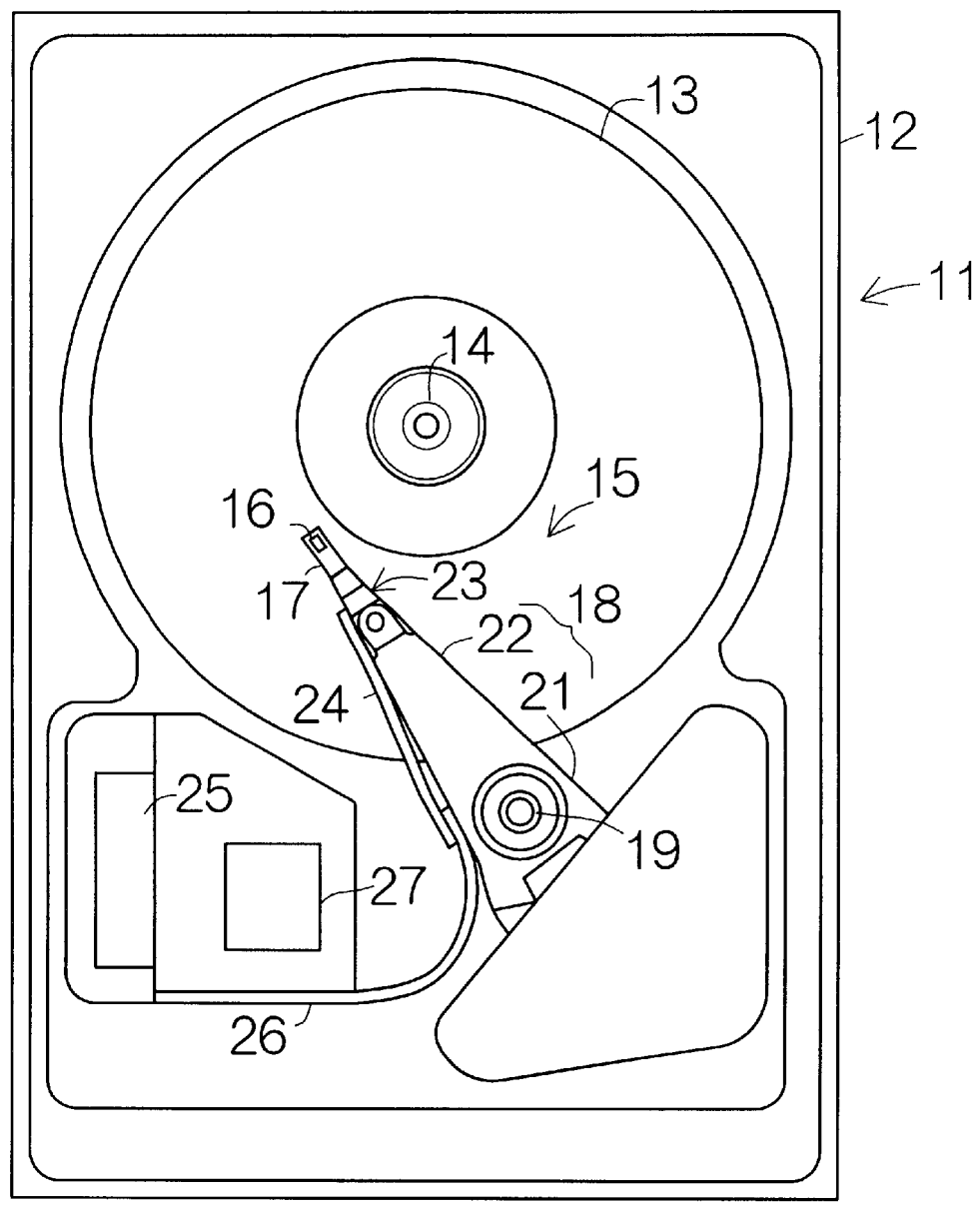
FIG. 1 is a plan view schematically illustrating the inner structure of a hard disk drive (HDD)

FIG. 1 illustrates a hard disk drive (HDD) 11 as an example of a recording medium drive. The HDD 11 includes a primary enclosure 12 defining an inner space. One or more recording medium or magnetic disks 13 are incorporated within the inner space. The magnetic disks 13 are supported on a rotational rod of a spindle motor 14. The spindle motor 14 is designed to drive the magnetic disks 13 for rotation at a higher rotational speed, such as 7,200 rpm or 10,000 rpm, for example. A cover, not shown, may be coupled to the primary enclosure 12 so as to air-tightly close the inner space.

A head assembly 15 is also enclosed within the inner space so as to face the respective surfaces of the magnetic disks 13 at the tip or free ends. The head assembly 15 includes one or more head suspensions 17 as driven members each designed to support an individual head slider 16 at the tip or leading end, and a support member or carriage 18 designed to support the head suspensions 17, as described later in detail. The head suspension 17 is allowed for movement relative to the carriage 18. As conventionally known, a read/write head is formed on the head slider 16 by a thin film forming technique, for example. The read/write head may include a read head element employed to read magnetic binary data out of the magnetic disk 13, and a write head element employed to write magnetic binary data into the magnetic disk 13. The read head element may be represented by a giant magnetoresistive (GMR) element, a tunnel-junction magnetoresistive (TMR) element, and the like. The write head element may be represented by a thin film magnetic head element or a so-called inductive head element.

The carriage 18 includes a rotative body 21 mounted on a support axis 19, and a plurality of arms 22 extending from the rotative body 21. When the rotative body 21 is driven to rotate about the support axis 19, the arms 22 integral to the rotative axis 19 are allowed to swing about the support axis 19. For example, an electromagnetic actuator 21 is employed to achieve the swinging movement of the arms 22. As conventionally known, when two or more magnetic disks 13 are enclosed in the primary enclosure 12, a pair of the head sliders 16, namely, the head suspensions 17 are assigned to the individual arm 22 disposed between the adjacent magnetic disks 13.

A microactuator 23 is interposed between the individual head suspension 17 and the carriage 18. The microactuator 23 is allowed to cause a relative movement between the corresponding head suspension 17 and the carriage 18 in response to a supplied driving voltage. Such a relative movement can be represented by a swinging movement around a swinging axis parallel to the support axis 19 at the tip end of the arm 22, as described later in detail.

When the specific arm 22 of the carriage 18 is caused to swing around the support axis 19 in the head assembly 15, the head suspension 17 is allowed to move across the magnetic disk 13 in the radial direction. Simultaneously, when the head suspension 17 is caused to swing around the swinging axis at the tip end of the arm 22, the head slider 16 at the tip end of the head suspension 17 is also allowed to move in the radial direction. Such a cooperation of the arm 22 of the carriage 18 and the head suspension 17 serves to position the read/write head on the head slider 16 right above a target recording track on the magnetic disk 13.

Here, the head slider 16 is allowed to keep following the target recording track by a fine alignment achieved by the microactuator 23 in addition to a rough alignment achieved by the arm 22 of the carriage 18, as conventionally known. The microactuator 23 is designed to servo control the position of the head slider 16 by utilizing a feedback signal generated based on the actual position of the head slider 16 relative to the magnetic disk 13, in other words, based on the amount of a positional deviation measured between the head slider 16 and the target recording track. During the servo control, the microactuator 23 receives a driving voltage which follows variation in the feedback signal. The combination of the rough alignment by the carriage 18 or arm 22 and the fine alignment by the head suspension 17 allows for a servo band of a relatively higher frequency range in the head assembly 15.

As is apparent from FIG. 1, relay flexible printed circuit boards (FPCs) 24 and a main flexible printed circuit board (FPC) 26 are coupled to the carriage 18. The relay FPCs 24 are designed to extend from the tip or leading ends of the arms 22 to the joints of the arms 22, namely, the rotative body 21, respectively. The main FPC 26 is designed to receive the relay FPCs 24 on the rotative body 21 and extend from the rotative body 21 to a connector 25. The main FPC 26 may receive thereon a head IC (Integrated Circuit) 27 for controlling the read/write operations of the aforementioned read/write head. The head IC 27 is designed to supply a sense current to the read head element and to generate information data based on the supplied sense current, when the information data is to be read out of the magnetic disk 13. Also, the head IC 27 is designed to supply an inductive current to the write head element when the information data is to be written into the magnetic disk 13.

Figure 2:
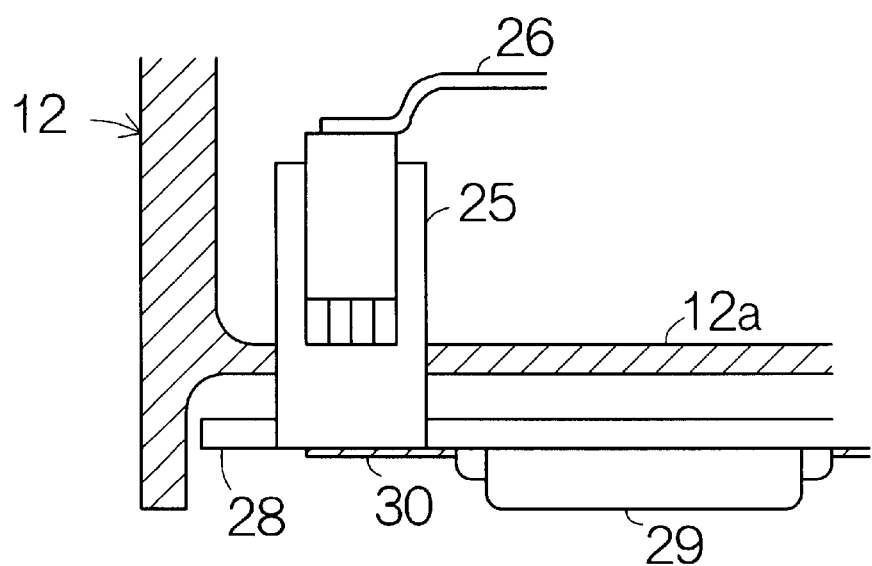
FIG. 2 is an enlarged partial sectional view taken along the line 2—2 in FIG. 1.

The connector 25 is fixed at a bottom plate 12a of the enclosure 12. As shown in FIG. 2, the connector 25 is allowed to penetrate through the bottom plate 12a of the enclosure 12. Specifically, the connector 25 includes internal conductive wires or lines exposed, at one end, to the inner space on the front side of the bottom plate 12a, and at the other end, to the external space or open air on the back side of the bottom plate 12a which serves to separate the inner space and the open air from each other. The internal conductive line may serve as a part of a driving signal line of the present invention.

As conventionally known, a printed circuit board 28 is attached to the back side of the bottom plate 12a in the open air. An actuator driver IC 29 is mounted on the printed circuit board 28, for example. The actuator driver IC 29 may include a digital/analog converter (DAC) as a voltage source designed to generate an analog or voltage signal based on a digital signal, an amplifier circuit designed to amplify the voltage supplied from the DAC so as to generate the driving voltage for the microactuator 23, and a DC/DC converter designed to supply a source voltage to the amplifier circuit. The actuator driver IC 29 is connected to the internal conductive lines within the connector 25 through a conductive wiring pattern 30 formed on the printed circuit board 28, for example. The conductive wiring pattern 30 may serve as a part of a driving signal line of the present invention.

Figure 3:
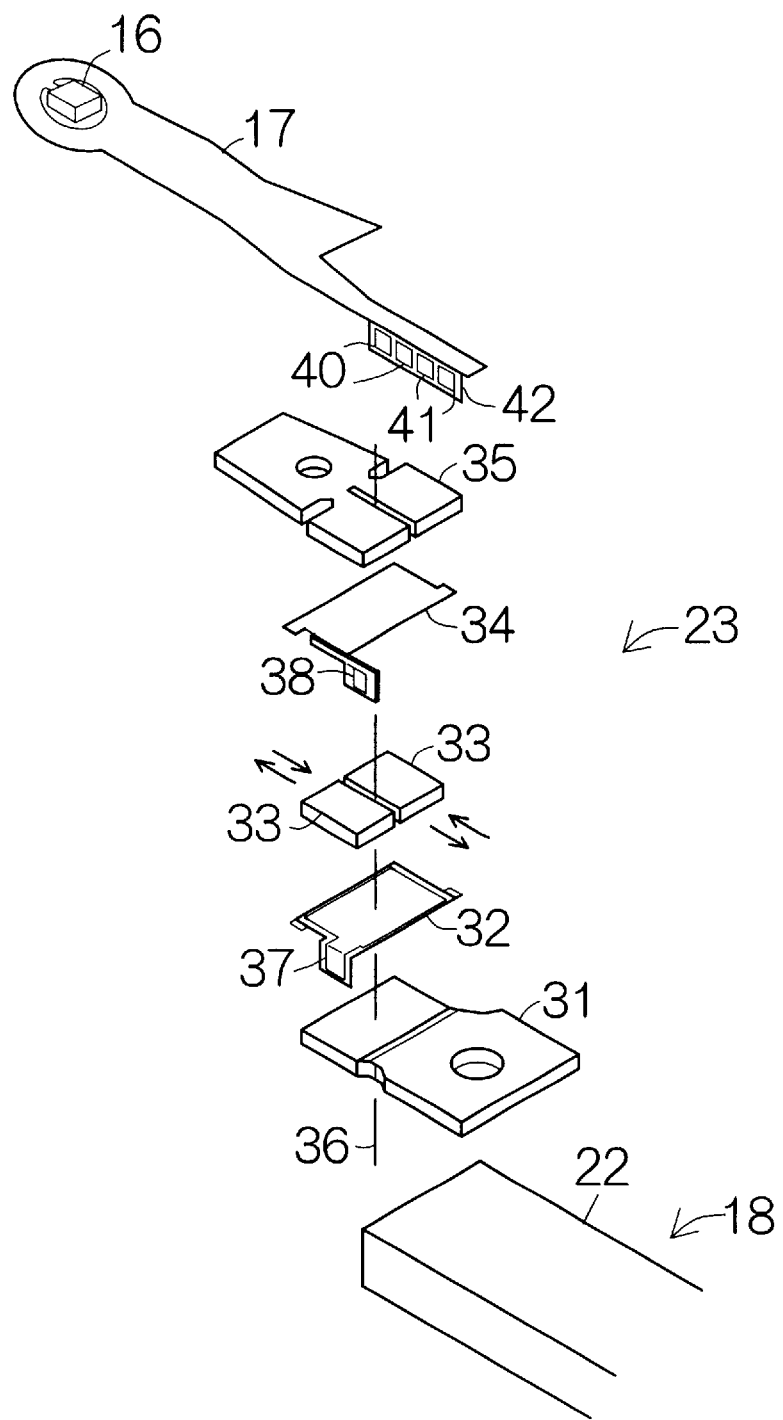
FIG. 3 is an exploded view schematically illustrating the structure of a microactuator.

As shown in FIG. 3, the microactuator 23 includes a first connecting plate 31 superposed and fixed on the surface of the arm 22 at the tip end of the arm 22. A first electrode plate 32 is fixed on the surface of the first connecting plate 31. The first electrode plate 32 may comprise an insulating thin plate or sheet superposed on the first connecting plate 31, and a conductive thin film or lamination formed on the surface of the insulating thin plate. A pair of shear piezoelectric elements 33, 33 are superposed on the surface of the first electrode plate 32. A second electrode plate 34 cooperates with the first electrode plate 32 so as to hold the piezoelectric elements 33, 33 between the first and second electrode plates 32, 34. A conductive adhesive may be employed to adhere the piezoelectric elements 33, 33 to the surfaces of the first and second electrode plates 32, 34, respectively.

The first electrode plate 32, the piezoelectric elements 33, 33 and the second electrode plate 34, superposed one another in this manner, are interposed between the first connecting plates 31 and a second connecting plate 35. The base or root end of the head suspension 17 is superposed and fixed on the surface of the second connecting plate 35. The second connecting plate 35 may be stuck to the surface of the second electrode plate 34. The second electrode plate 34 may comprise an insulating thin plate or sheet superposed on the second connecting plate 35, and a conductive thin film or lamination formed on the surface of the insulating thin plate in the same manner as the aforementioned first electrode plate 32. When a driving voltage is applied to the first and second electrode plates 32, 34, the piezoelectric elements 33, 33 generate shears in the opposite directions. As a result, the head suspension 17 is caused to swing around the swinging axis 36 with respect to the arm 22 of the carriage 18.

Terminal plates 37, 38 are integrally formed on the first and second electrode plates 32, 34. The terminal plates 37, 38 may be punched out of a layered composition, comprising the aforementioned insulating thin plate and conductive film, along with the first and second electrode plates 32, 34, respectively, for example. The terminal plates can be shaped in the punched-out layered composition by simply folding the punched-out layered composition. The terminal plates 37, 38 are designed to stand upright to the first and second electrode plates 32, 34, respectively. In this manner, the terminal plates 37, 38 are allowed to extend along the side surface of the arm 22.

A standup plate 42 is formed on the head suspension 17 so as to take the attitude upright to the head suspension 17, for example. The standup plate 42 may likewise be formed by folding the portion of a plate-shaped material resulting in the head suspension 17. The outer surface of the standup plate 42 is designed to receive a pair of read-out terminal pads 40, 40 for a data signal of the read head element, and a pair of write terminal pads 41, 41 for a data signal of the write head element. When the microactuator 23 and the head suspension 17 are set up on the arm 22, the terminal plates 37, 38 and the terminal pads 40, 41 are arrayed in line at the edge of the arm 22. As conventionally known, the terminal pads 40, 41 are electrically connected to the respective signal terminals, not shown, on the head slider 16 through a conductive wiring pattern, not shown, formed on the surface of the head suspension 17. The signal terminals are usually connected to the read and write head elements on the head slider 16.

Figure 4:
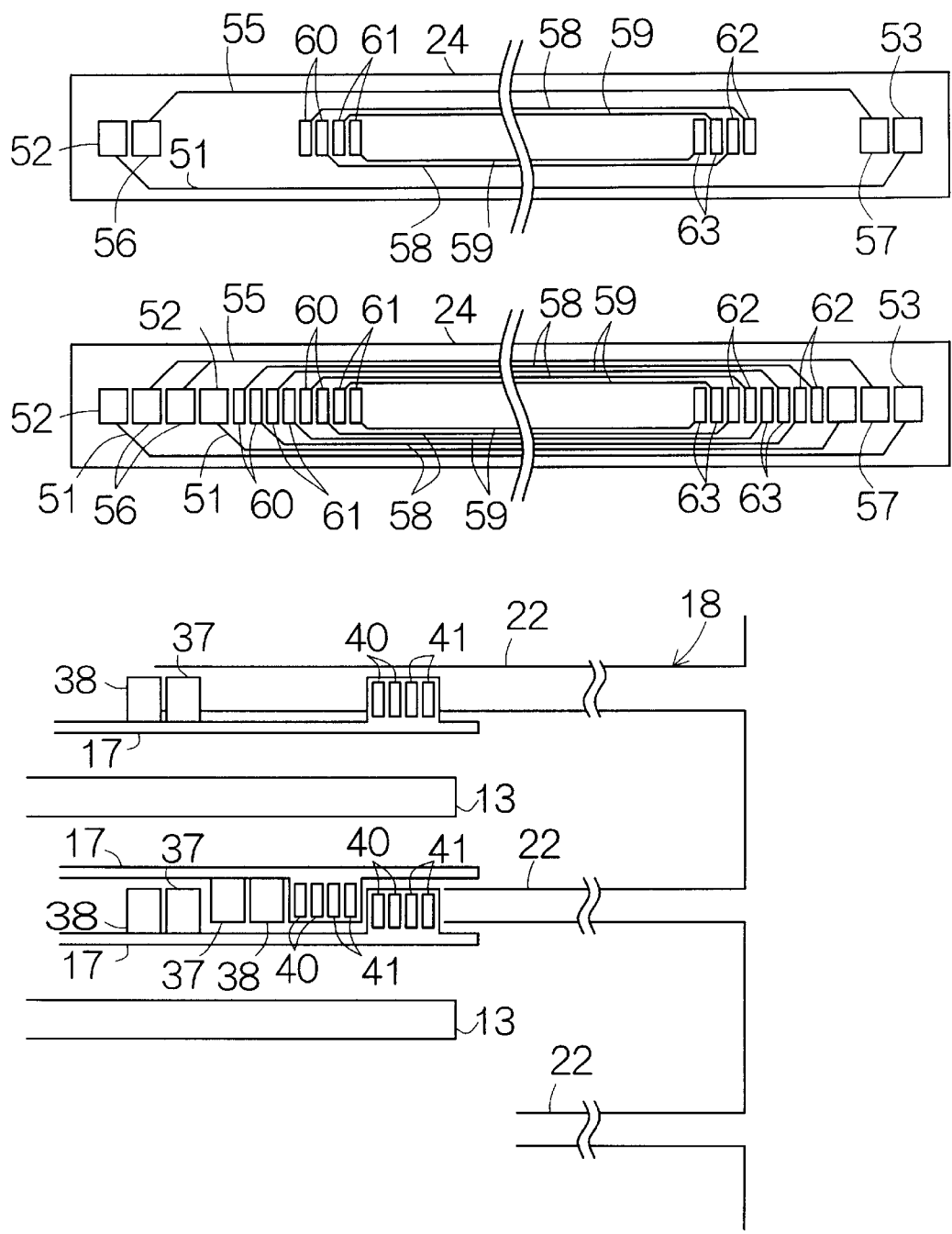
FIG. 4 is an enlarged plan view illustrating a relay flexible printed circuit board (FPC)

As shown in FIG. 4, a relay or intermediate driving signal line 51 or a pair of those are formed on the respective relay FPC 24 so as to be connected to the individual second electrode plate 34. The relay driving signal line 51 is designed to receive the corresponding terminal plate 38 of the second electrode plate 34 at a connection pad 52 formed at the tip or front end of the relay driving signal line 51. The terminal plate 38 may be fixed to the connection pad 52 by soldering, for example. Another connection pad 53 is formed at the root or rear end of the relay driving signal line 51.

Likewise, a relay or intermediate ground line 55 is formed on the respective relay FPC 24 so as to be connected to the first electrode plate 32. The relay ground line 55 is designed to receive the corresponding terminal plate or plates 37 of the first electrode plate or plates 32 at a connection pad or pads 56 formed at the tip or front end of the relay ground line 55. Here, the single relay FPC 24 can be utilized common to a pair of upper and lower head suspensions 17, 17 fixed on the single arm 22. Accordingly, the single relay ground line 55 is solely disposed common to the upper and lower head suspensions 17, 17. A pair of connection pads 56 are formed at the tip or front end of the relay ground line 55 so as to receive the respective terminal plates 37, 37 of the upper and lower head suspensions 17, 17. A connection pad 57 is further formed at the root or rear end of the relay ground line 55.

Moreover, relay or intermediate data signal lines 58, 59 are formed on the relay FPC 24 for a data signal of the read head element and a data signal of the write head element, respectively. The relay data signal lines 58, 59 are designed to receive the terminal pads 40, 41 at connection pads 60, 61 formed at the tip or front ends of the relay data signal lines 58, 59, respectively. Connection pads 62, 63 are also formed at the root or rear ends of the relay data signal lines 58, 59, respectively. The relay driving signal line 51, the relay ground line 55 and the relay data signal lines 58, 59 may be formed by a conductive wiring pattern formed on the surface of a flexible resin plate or sheet.

Figure 5:
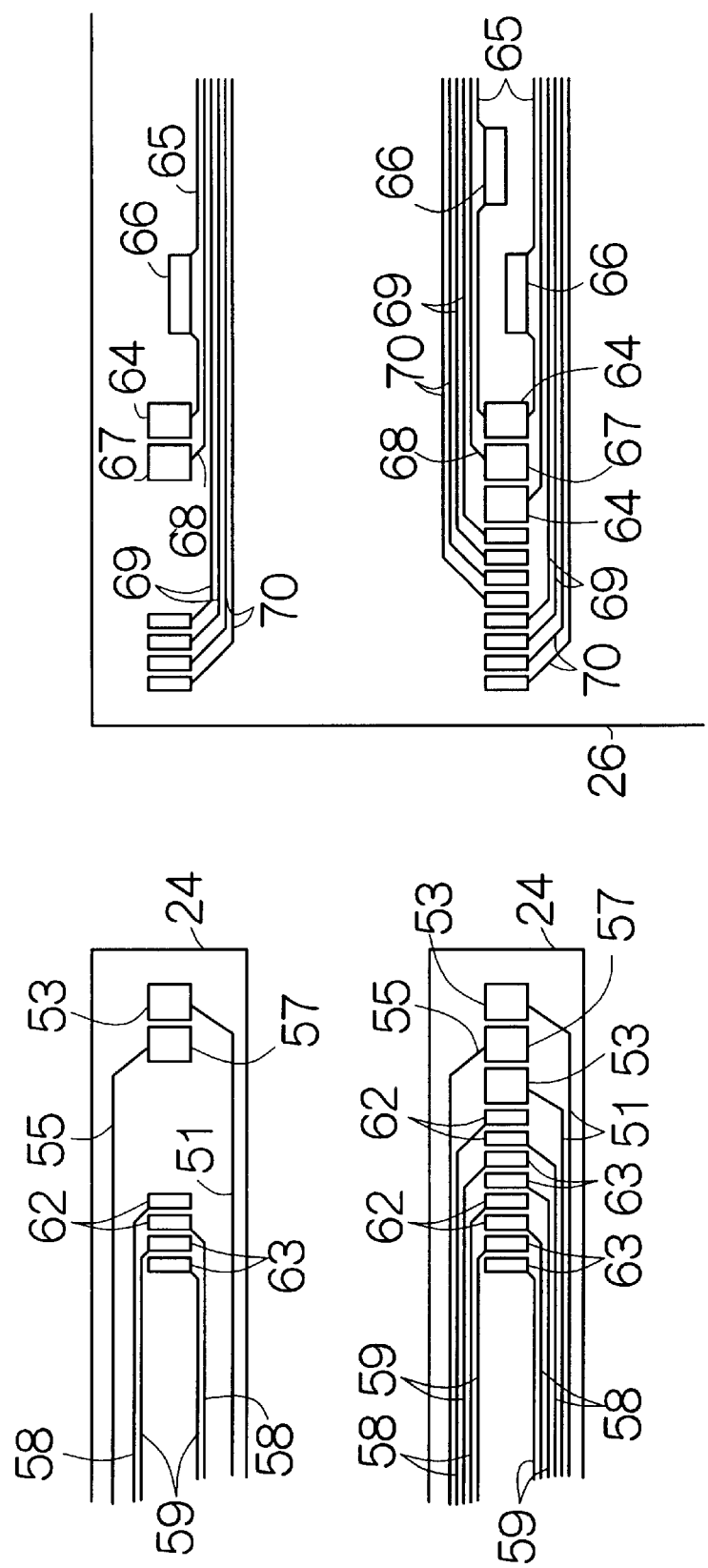
FIG. 5 is an enlarged plan view illustrating a main flexible printed circuit board (FPC)

As shown in FIG. 5, primary driving signal lines 65 are formed on the main FPC 26. Each of the primary driving signal lines 65 extends from a connection pad 64 at the tip or front end to the internal conductive line in the connector 25. The connection pad 64 is designed to receive the connection pad 53 of the relay driving signal line 51. The connection pad 53 of the relay driving signal line 51 may be fixed to the connection pad 64 of the primary driving signal line 65 by soldering, for example. The primary driving signal line 65 is disposed for every head suspension 17. A chip resistor 66 is inserted in each of the primary driving signal line 65. The chip resistor 66 may be soldered at a gap defined in the primary driving signal line 65, for example.

Likewise, primary ground lines 68 are formed on the main FPC 26. Each of the primary ground line 68 extends from a connection pad 67 at the tip or front end to the internal conductive line in the connector 25. The connection pad 67 is designed to receive the connection pad 57 of the relay ground line 55. The connection pad 57 of the relay ground line 55 may be fixed to the connection pad 67 of the primary ground line 68 by soldering, for example. The primary ground line 68 is disposed for every relay FPC 24.

Moreover, primary data signal lines 69, 70 are also formed on the main FPC 26 so as to receive the respective connection pads 62, 63 of the relay data signal lines 58, 59 at the tip ends. Each of the primary data signal lines 69, 70 is designed to extend to the head IC 27. The connection pads 62, 63 may be fixed to the primary data signal lines 69, 70, respectively, by soldering, for example. The primary data signal line 69, 70 is disposed for every head suspension 17. The head IC 27 is connected to the internal conductive line in the connector 25 through a conductive wiring pattern, not shown, formed on the surface of the main FPC 26.

Now, assume that the carriage 18 along with the arms 22 swings so as to position the head slider 16 right above a target recording track on the magnetic disk 13. The head IC 27 is designed to receive a positional information data read by the read head element, namely, a feedback signal identifying the actual position of the read and write head elements in the radial direction of the magnetic disk 13. The actual position may be represented by a deviation amount of the read head element from the target recording track, for example. The head IC 27 then generates a digital control signal based on the received feedback signal. The digital control signal defines a driving or shift amount for the head slider 16, namely, a swinging amount for the head suspension 17. The driving or swinging amount is set to counteract the deviation amount detected by the read head element. The thus generated digital control signal is thereafter supplied to the actuator driver IC 29 outside the inner space. The space containing the actuator driver IC 29 is completely isolated by the bottom plate 12a of the primary enclosure 12 from the inner space.

When the actuator driver IC 29 receives the digital control signal in this manner, the DAC generates a voltage specified by the digital control signal in the actuator driver IC 29. The generated voltage is then amplified in the amplifier circuit. The amplifier circuit is designed to receive a source voltage from the DC/DC converter so as to realize amplification. The amplifier circuit outputs the amplified voltage as the driving voltage. The driving voltage is led to the primary driving signal line 65 via the wiring pattern 30 on the printed circuit board 28 and the internal conductive lines within the connector 25. The driving voltage finally reaches the second electrode plate 34 through the primary driving signal line 65 and the relay driving signal line 51. The driving voltage can be applied to the piezoelectric elements 33 based on the potential difference between the electric potential of the first electrode plate 32 and the driving voltage reaching the second electrode plate 34. The piezoelectric elements 33 generate shears in response to the applied driving voltage. The shears serve to induce the swinging movement of the head suspension 17.

The tracking action of the head slider 16, namely, the servo control of the head suspension 17 can be achieved in this manner based on the driving voltage applied to the microactuator 23. The microactuator 23 is forced to function as a capacitance in response to supply of the driving voltage. The microactuator 23 cooperates with the chip resistor 66 so as to achieve the function of a low pass filter. Even if the driving voltage includes a high frequency noise resulting from the operation of the DC/DC converter, the low pass filter, comprising the microactuator 23 and the chip resistor 66, serves to eliminate or remove the high frequency noise. Elimination of the high frequency noise enables a reliable prevention of a mechanical or physical resonance or vibration resulting from any factors such as the natural frequency of the head suspension 17 and the like. The servo control of the head suspension 17, namely, the tracking action of the head slider 16 can be stabilized. To the contrary, if a high frequency component equivalent to the natural frequency of the head suspension 17 is introduced in the driving voltage, the head suspension 17 inevitably suffers from a resonance or vibration, so that tracking action of the head slider 16 may be hindered. Specifically, this type of the driving voltage will disturb the operation of the servo system. A reliable or stable servo control cannot be achieved.

Figure 6:
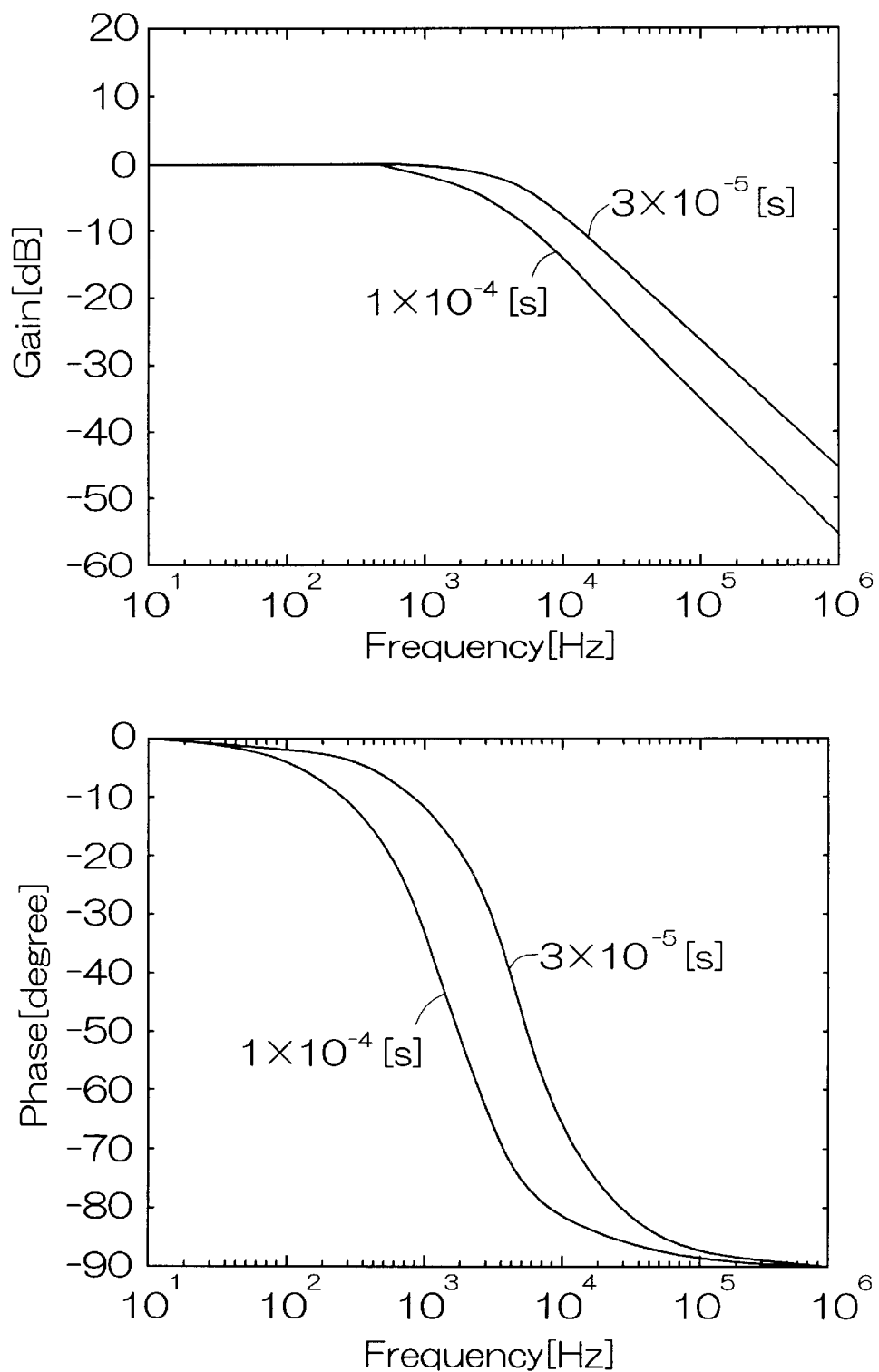
FIG. 6 is a graph illustrating a relationship between a time constant (the product of the capacitance of the microactuator and the resistive value of the resistor) and frequency and phase characteristics of the driving voltage.

Now, assume that the head suspension 17 has the natural frequency of 10 kHz, for example, while the control band below 2 kHz is set for the microactuator 23. In this case, when the product of the capacitance of the microactuator 23 and the resistive value of the chip resistor 66, in other words, the time constant is set at $3.0 \times 10^{-5}$ [s], as shown in FIG. 6, a cutoff frequency of 5 kHz can be obtained. In general, a cutoff frequency can be defined by a frequency at the gain of –3 dB. The gain can be reduced in the high frequency range beyond 5 kHz. Specifically, the driving voltage is prevented from including a high frequency component over 5 kHz. A stimulus of a higher mode is hardly generated in the head suspension 17. Likewise, when the time constant is set at $1.0 \times 10^{-4}$ [s], as is apparent from FIG. 6, the gain can further be reduced in the high frequency range.

However, when the time constant is set at $3.0 \times 10^{-5}$ [s] in the aforementioned manner, the phase shift or lag is allowed to remain within 20 degrees at the frequency of 2 kHz, as is apparent from FIG. 6. On the other hand, when the time constant is set at $1.0 \times 10^{-4}$ [s], a larger phase shift or lag such as approximately 60 degrees may be generated. Such a larger phase shift in general deteriorates the accurate tracking action of the head slider 16 and the stability of the servo system. It is preferable that the time constant, equivalent to the product of the capacitance of the microactuator 23 and the resistive value of the chip resistor 66, is set at a value equal to or smaller than $3.0 \times 10^{-5}$ [s].

In general, when the cutoff frequency is maintained at a relatively higher frequency, a digital filter, not shown, is connected to the microactuator 23. The digital filter may be incorporated in the actuator driver IC 29, for example. The digital filter usually causes a phase shift or lag of approximately 90 degrees, for example. In this case, if the time constant is set at a larger value such as $3.0 \times 10^{-4}$ [s] in a combination of the microactuator 23 and the chip resistor 66, the cutoff frequency can be further lowered, for example, to approximately 500 Hz. Such a low cutoff frequency enables elimination of the digital filter. It is possible to reduce the phase shift or lag irrespective of an increase in the time constant. It should be noted that the gain may be reduced in a frequency range between 500 Hz–2 kHz so that a larger driving voltage is required to obtain an appropriate amplitude.

Furthermore, the aforementioned chip resistor 66 is allowed to eliminate not only a high frequency noise resulting from the DC/DC converter but also a high frequency noise transmitted to the primary driving signal line 65 from the adjacent primary data signal lines 69, 70. Elimination of such a transmitted high frequency noise serves to further reliably prevent the head suspension 17 from inducing the mechanical or physical resonance. In particular, in the case where the relay and primary driving signal lines 51, 65 are respectively disposed adjacent the relay data signal lines 58, 59 and the primary data signal lines 69, 70 in the aforementioned manner, the chip resistor 66 is preferably located near the microactuator 23 as closer as possible.

Moreover, the actuator driver IC 29 is isolated from the inner space by the bottom plate 12a of the primary enclosure 12 in the aforementioned manner, a high frequency noise leaking from the actuator drive IC 29 cannot enter or reach the inner space within the primary enclosure 12. Accordingly, the relay and primary driving signal lines 51, 65 can reliably be protected from such a high frequency noise. Also, the head suspension 17 can reliably be protected from a direct transmission of such a high frequency noise potentially resulting in a mechanical or physical resonance. The actuator driver IC 29 isolated from the inner space behind the bottom plate 12a greatly contributes to a stable servo control.

Figure 7:
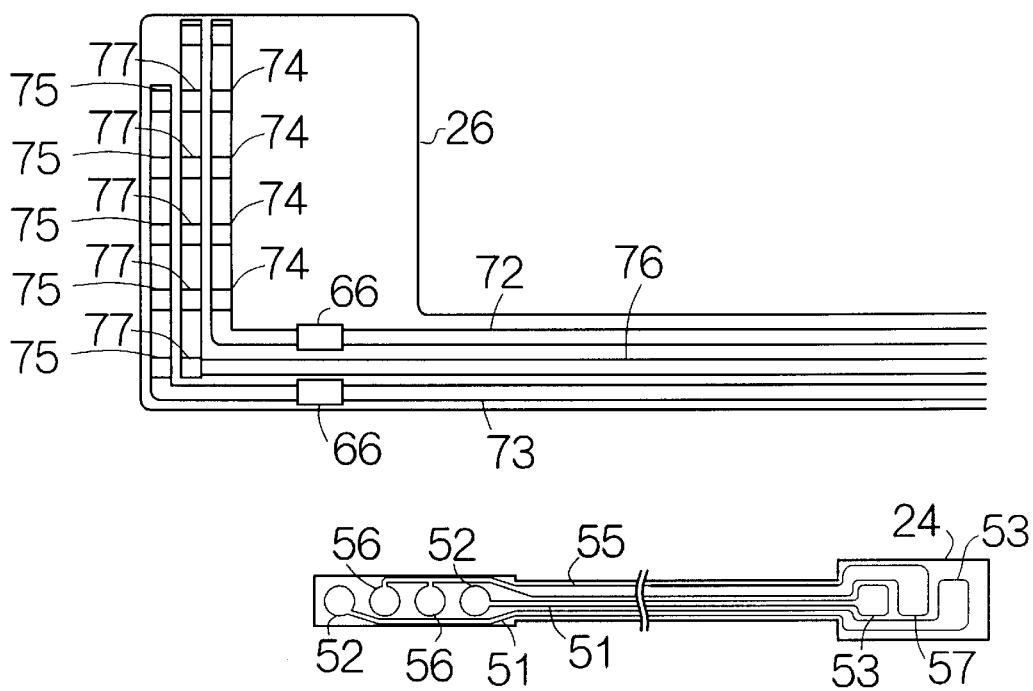
FIG. 7 is a schematic view illustrating a relay FPC and a main FPC according to another specific embodiment.

FIG. 7 schematically illustrates the relay FPC 24 and the main FPC 26 according to another embodiment of the present invention. In this embodiment, the main FPC 26 is designed to receive thereon a first primary driving signal line 72 disposed common to the lower head suspensions 17 on the respective arms 22, and a second primary driving signal line 73 disposed common to the upper head suspensions 17 on the respective arms 22. Branch points 74, 75 can be defined at the connection pads 64 of the first and second primary driving signal lines 72, 73, respectively. A common primary driving signal line is provided in this manner so as to extend from the connector 25 to the branch points 74, 75, respectively. When the connection pads 51 of the relay driving signal lines 51 are received on the corresponding connection pads 64 for the respective branch points 74, 75, a plurality of branch driving signal lines may be provided to individually extend from the respective branch points 74, 75 toward the corresponding microactuators 23. The primary driving signal lines 74, 75 for the respective groups of the relay driving signal lines 51 in this manner enables a simple insertion of the single chip resistor 66 in the primary driving signal line 74, 75 common to the relay driving signal lines 51, as shown in FIG. 7. As compared with the case where the primary driving signal line 65 is connected to every relay driving signal line 51 in the aforementioned manner, less chip resistors 66 are required to establish the aforementioned low pass filter. It leads to cost reduction.

Moreover, a single or common primary ground line 76 can be employed common to all of the head suspensions 17 in this embodiment. Branch points 77 are defined at the respective connection pads 66 on the primary ground line 76. When the connection pads 57 of the relay ground lines 55 are received on the corresponding connection pads 67 for the respective branch points 77, a plurality of branch ground lines may be provided to individually extend from the respective branch points 77 toward the corresponding microactuators 23. Employment of less primary driving signal lines 72, 73 and the single primary ground line 77 in this manner enables a facilitated structure of the connector 25 which serves to electrically connect the inner and outer spaces isolated from each other by the primary enclosure 12. Less internal conductive lines are required in the connector 25.

Figure 8:
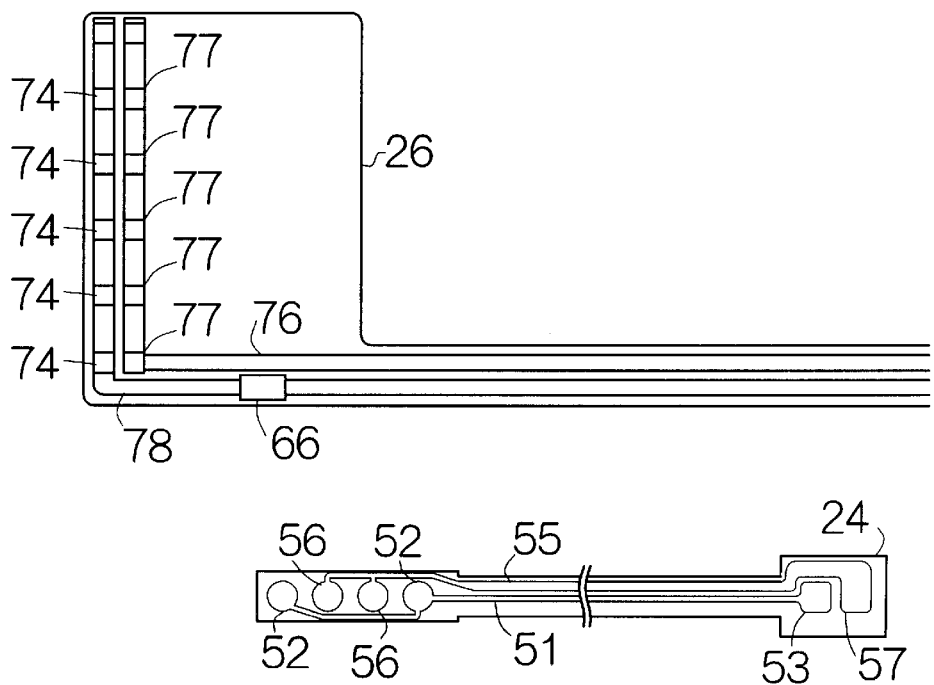
FIG. 8 is a schematic view illustrating a relay FPC and a main FPC according to a further specific embodiment.

For example, a single or common primary driving signal line 78 can be employed, as shown in FIG. 8, for all of the microactuators 23. The single primary driving signal line 78 enables a simple insertion of the single chip resistor 66. Further cost reduction can be achieved. In addition, the quantity of the internal conductive lines can further be reduced in the connector 25. The single relay driving signal line 51 may be formed on the relay FPC 24 common to a pair of the microactuators 23. The relay driving signal line 51 in this manner solely requires the single connection pad 53.

It should be noted that the first electrode plate 32 can be eliminated in the aforementioned microactuator 23, for example. In this case, the carriage 18 may be employed as a ground. Also, a conductor such as a Nichrome wire, of a higher volume resistivity, may be employed in place of the aforementioned chip resistor 66. Furthermore, a Nichrome wire can be employed to connect the terminal plate 38 of the second electrode plate 34 and the connection pad 64 of the primary driving signal line 65 in place of the aforementioned relay driving signal line 51.

Figure 9:
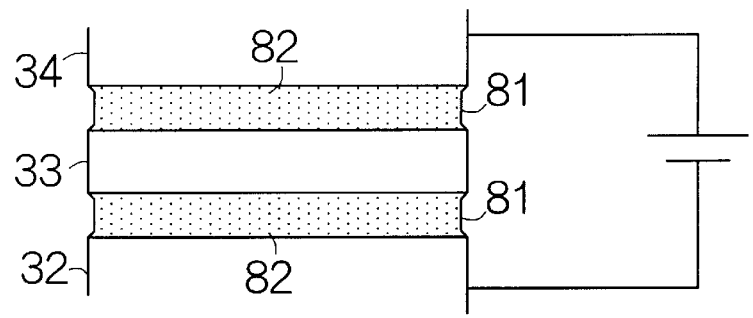
FIG. 9 is a schematic view illustrating the concept of a conductive adhesive layer as an alternative to a chip resistor.

As shown in FIG. 9, the chip resistor 66 can be replaced with a conductive adhesive layer 81 interposed between the first electrode plate 32 and the piezoelectric elements 33 and between the second electrode plate 34 and the piezoelectric elements 33 in the microactuator 23. The resistive value of the conductive adhesive layer 81 can be adjusted in accordance with the material and/or the amount of conductive powder 82 contained in the conductive adhesive layer 81. A conductive adhesive including a predetermined amount of the conductive powder 82 may be injected between the first electrode plate 32 and the piezoelectric elements 33 as well as between the second electrode plate 34 and the piezoelectric elements 33 so as to form the conductive adhesive layers 81, respectively. When the injected conductive adhesive gets hardened or cured, the conductive adhesive layers 81 can be obtained. This arrangement serves to locate a resistor closest to the piezoelectric elements 33, so that the resistor made of the conductive adhesive layer 81 is allowed to reliably eliminate or remove a high frequency noise transmitted to the relay and primary driving signal lines 51, 65, 72, 73, 78 from the adjacent relay data signal lines 58, 59 as well as the primary data signal lines 69, 70.

Figure 10:
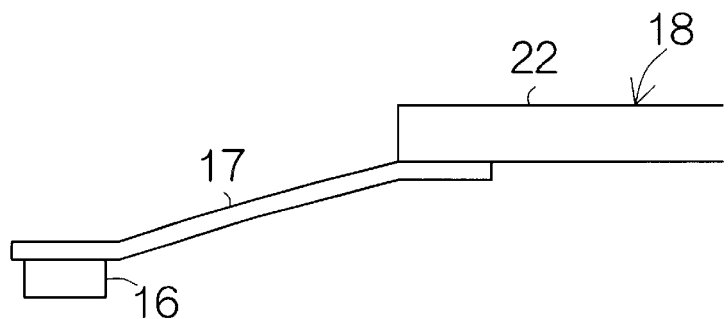
FIG. 10 is a side view schematically illustrating the structure of a head assembly according to another specific embodiment.

FIG. 10 schematically illustrates a head assembly 15 according to another embodiment of the present invention. The head assembly 15 includes a head suspension 17 supporting a head slider 16 at the tip or leading end, and a carriage 18 receiving the base or root end of the head suspension 17 at the tip or leading end, in the same manner as the aforementioned embodiment. The head suspension 17 is fixed to the tip or leading end of an arm 22 of the carriage 18.

Figure 11:
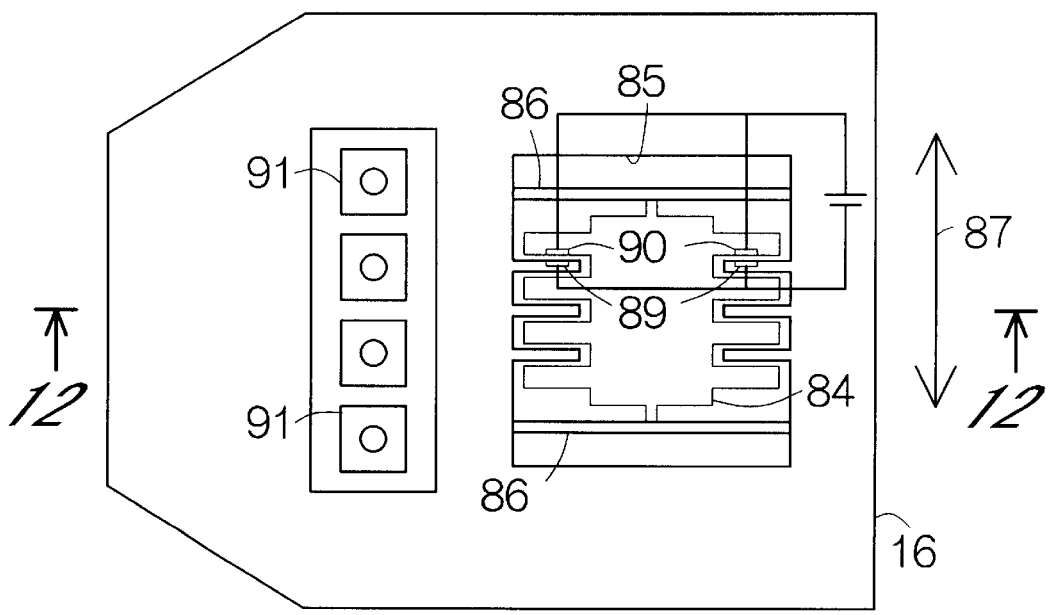
FIG. 11 is an enlarged plan view schematically illustrating the structure of a microactuator according to another specific embodiment.

As shown in FIG. 11, a driven member 84 is assembled within the head slider 16 for supporting a read/write head, not shown. The driven member 84 is supported on a pair of elastic beams 86 within a window opening 85 defined in the head slider 16, for example. The elastic beams 85 serve to allow the driven member 84 to shift or move in the radial direction 87 of the magnetic disk 13.

A microactuator 88 is interposed between the head slider 16 and the driven member 84. The microactuator 88 includes a stationary or stable first electrode 89 fixed to the head slider 16, and a second electrode 90 fixed to the driven member 84 so as to face the first electrode 89 at a distance. As conventionally known, the microactuator 88 serves to generate a horizontal driving force in the radial direction 87 in response to the magnitude of a driving voltage applied to a gap between the first and second electrodes 89, 90. This type of the microactuator 88 is in general called a capacitance actuator.

Figure 12:
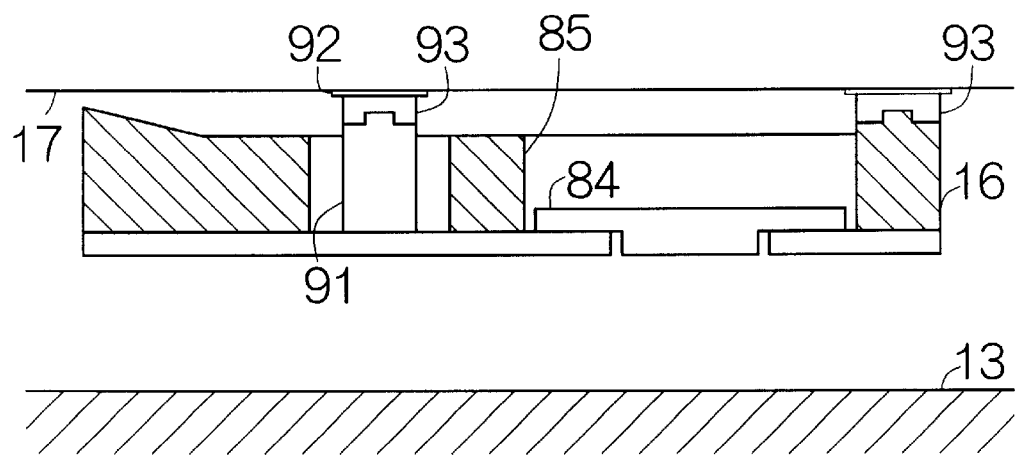
FIG. 12 is an enlarged sectional view taken along the line 12—12 in FIG. 11.

Conductive terminals 91 are electrically connected to the first and second electrodes 89, 90. As shown in FIG. 12, driving signal lines 92 are connected to the respective conductive terminals 91. The driving signal lines 92 may be formed on the surface of the head suspension 17. A conductive adhesive layer 93 may be employed to establish the connection between the driving signal lines 92 and the conductive terminals 91, respectively. A driving voltage output from the actuator driver IC 29 can be supplied to the first and second electrodes 89, 90 through the driving signal lines 92 and the conductive terminals 91. The resistive value of the conductive adhesive layer 93 can be adjusted in accordance with the material and/or the amount of the conductive powder contained in the conductive adhesive layer 93 in the aforementioned manner. This arrangement also serves to locate a resistor closest to the microactuator 88, so that the resistor made of the conductive adhesive layer 93 is allowed to reliably eliminate or remove a high frequency noise involuntarily introduced in the driving signal lines 92.

It should be noted that the microactuator 23 can be interposed not only between the carriage 18 and the head suspension 17 in the aforementioned manner, but also between the head suspension 17 and the head slider 16 as well as between the head slider 16 and the read/write head (or read or write head element). The microactuator 23, 88 may comprise any structure equivalent to a capacitance other than the aforementioned piezoelectric elements 33 and a so-called capacitance actuator.

What is claimed is:

1. A recording medium drive comprising:
   a recording medium;
   a head related to the recording medium;
   a driven member supporting the head;
   a support member designed to support the driven member for a relative movement;
   a microactuator interposed between the driven member and the support member so as to cause the relative movement between the driven member and the support member based on a driving voltage;
   a voltage source generating the driving voltage following variation in a feedback signal generated based on a position of the head relative to the recording medium; and
   a resistor interposed in serial between the voltage source and the microactuator, the resistor in combination with the microactuator establishing a low pass filter for eliminating from the driving voltage a high frequency component corresponding to a natural frequency of the driven member.

2. The recording medium disk according to claim 1, wherein said resistor is a chip resistor.

3. The recording medium disk according to claim 1, wherein said resistor is inserted in a driving signal line attached to the support member for carrying the driving voltage to the microactuator.

4. The recording medium disk according to claim 3, wherein said resistor is a chip resistor.

5. A head assembly comprising:

a plurality of heads;

a plurality of driven members respectively supporting the head;

a common support member designed to support the driven members for a relative movement;

data signal lines attached to the support member for carrying a data signal of the head;

a microactuator interposed between the individual driven member and the support member so as to cause the relative movement between the individual driven member and the support member based on a driving voltage;

a driving signal line attached to the support member for carrying the driving voltage to the microactuator; and a resistor inserted in the driving signal line between the microactuator and a voltage source of the driving voltage, the resistor in combination with the microactuator establishing a low pass filter for eliminating from the driving voltage a high frequency component corresponding to a natural frequency of the driven member.

6. The head assembly according to claim 5, wherein said driving signal line comprises:

a common driving signal line extending from the voltage source to a branch point so as to accept interposition of the resistor; and a plurality of branch driving signal lines respectively extending from the branch point to the individual microactuator.

7. A head assembly comprising:

a piezoelectric element deforming in response to supply of a driving voltage;

first and second electrodes holding the piezoelectric element therebetween and leading the driving voltage to the piezoelectric element;

a conductive adhesive layer interposed between the piezoelectric element and at least one of the first and second electrodes;

a driven member fixed to the first electrode so as to support a head;

a support member fixed to the second electrode; and a driving signal line connected to the first and second electrodes so as to lead the driving voltage to the first and second electrodes.

8. The head assembly according to claim 7, wherein the conductive adhesive layer serves as a resistance having a desired resistance value between the piezoolectric element and at least one of the first and second electrodes.

9. The head assembly according to claim 7, wherein the conductive adhesive layer is made of a cured conductive adhesive including conductive powder.

10. A recording medium drive comprising:

an enclosure defining an inner space;

a recording medium disposed within the inner space;

a head disposed within the inner space with respect to the recording medium;

a driven member supporting the head;

a support member designed to support the driven member for a relative movement;

a microactuator interposed between the driven member and the support member so as to cause the relative movement between the driven member and the support member based on a driving voltage;

an amplifier amplifying a voltage from a voltage source so as to generate the driving voltage; and a DC/DC converter disposed outside the inner space and designed to supply a source voltage to the amplifier.

* * * * *